(12) United States Patent
Vishne et al.

(10) Patent No.: US 8,339,887 B2
(45) Date of Patent: Dec. 25, 2012

(54) DOUBLE LINE ACCESS TO A FIFO

(75) Inventors: Nahum N. Vishne, Elad (IL); Lior L. Bandel, Kfar Saba (IL); Nimrod Alexandron, Shimshit (IL)

(73) Assignee: LSI Corporation, Milpitas, CA (US)

( * ) Notice: Subject to any disclaimer, the term of this patent is extended or adjusted under 35 U.S.C. 154(b) by 233 days.

(21) Appl. No.: 12/948,008

(22) Filed: Nov. 17, 2010

(65) Prior Publication Data

US 2012/0120734 A1 May 17, 2012

(51) Int. Cl.
*G11C 7/00* (2006.01)
(52) U.S. Cl. ............... 365/221; 365/239; 365/233.1
(58) Field of Classification Search ............ 365/221, 365/233.1, 239, 230.08
See application file for complete search history.

(56) References Cited

U.S. PATENT DOCUMENTS

| | | | |
|---|---|---|---|
| 6,144,604 A | 11/2000 | Haller et al. | 365/221 |
| 6,809,984 B2 * | 10/2004 | Nagano | 365/230.05 |
| 7,181,563 B2 | 2/2007 | Andreev et al. | 711/5 |
| 7,444,491 B1 * | 10/2008 | Steinbusch | 711/170 |
| 2010/0238186 A1 * | 9/2010 | Park et al. | 345/558 |

OTHER PUBLICATIONS

Alfke, Peter, "Synchronous and Asynchronous FIFO Designs", Sep. 17, 1996, pp. 1-12.

* cited by examiner

*Primary Examiner* — Gene Auduong
(74) *Attorney, Agent, or Firm* — Christopher P. Maiorana, PC (57) ABSTRACT

An apparatus comprising a write data buffer circuit, a memory, and a read data buffer circuit. The write data circuit may be configured to present data in a second format in response to data received in a first format. The memory may be configured to (i) receive the data in the second format and (ii) present the data in the second format. The read data buffer circuit may be configured to (i) receive data in the second format and (ii) present data in a third format. The memory may be configured to allow two reads or two writes during a single clock cycle of reference clock without encountering a data overflow condition.

15 Claims, 13 Drawing Sheets

□ EMPTY FF

FF HOLDING VALID DATA

FF HOLDING VALID DATA THAT IS PART OF THE NEXT READ

EMPTY FF THAT IS PART OF THE NEXT WRITE

DOUBLE LINE ACCESS TO A FIFO

FIELD OF THE INVENTION

The present invention relates to memories generally and, more particularly, to a method and/or apparatus for implementing a double line access to a first-in first-out (FIFO) memory.

BACKGROUND OF THE INVENTION

A number of conventional approaches to implementing FIFO memories are available. One conventional approach uses flip-flops to implement a FIFO. Such an approach is relatively easy to implement, but is expensive in terms of area and power.

Another conventional approach uses a Random Access Memory (RAM) with a byte enable input. 2 ports are implemented for writing and 2 ports are implemented for reading. Implementing a RAM as part of a FIFO is also expensive.

Another conventional approach uses two RAM modules with one port for reading and one port for writing. One RAM module is used for odd lines and the second RAM module is used for even lines. With such an approach, every access can be for two consecutive FIFO lines in one cycle since every module is accessed for maximum 1 line. Each of the RAM modules has a byte enable input, so such an implementation is more expensive to implement than an approach without a RAM memory with a byte enable input.

Figure 1:
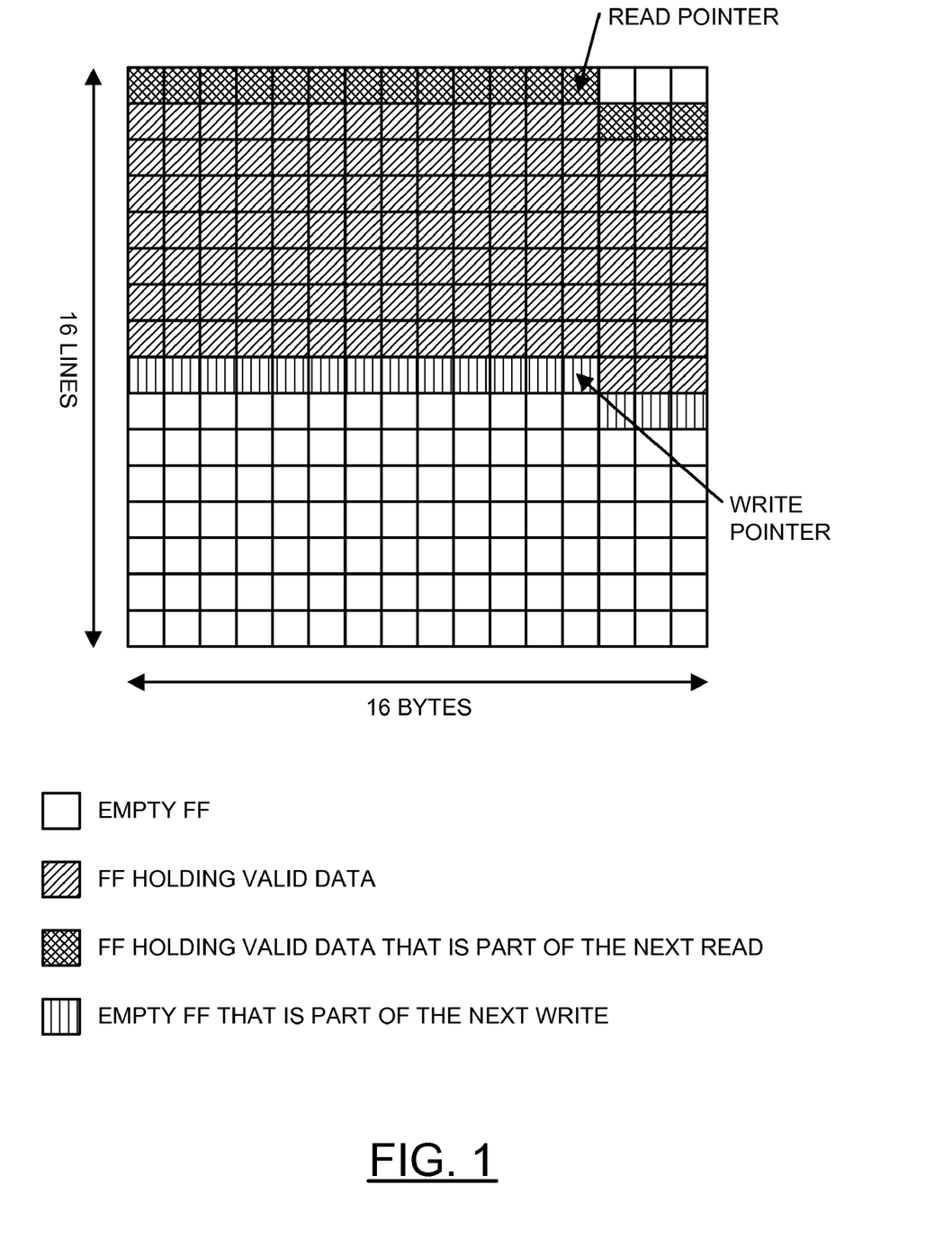
FIG. 1 is a diagram of a conventional approach for implementing a FIFO.

Referring to FIG. 1, one conventional approach is shown. Each of the memory cells is implemented as a flip-flop. When accessing the FIFO for a read, the read flip-flops will be accessed and the data will be read and sent out as 16 bytes read data. When accessing the FIFO for write, the write flip-flop will be accessed and the write data will be written. While such an approach is flexible, and can separately access every bit, such an approach uses a large amount of area and consumes a large amount of power.

It would be desirable to implement a FIFO that may handle a variable size of data and may (i) perform push and pop operations in one clock cycle, (ii) use a RAM with only one port for a read operation and one port for write operation, and/or (iii) be implemented without the need for a byte enable input.

SUMMARY OF THE INVENTION

The present invention concerns an apparatus comprising a write data buffer circuit, a memory, and a read data buffer circuit. The write data circuit may be configured to present data in a second format in response to data received in a first format. The memory may be configured to (i) receive the data in the second format and (ii) present the data in the second format. The read data'buffer circuit may be configured to (i) receive data in the second format and (ii) present data in a third format. The memory may be configured to allow two reads or two writes during a single clock cycle of a reference clock without encountering a data overflow condition.

The objects, features and advantages of the present invention include providing a memory that may (i) provide double line access to one port (either read or write) of FIFO (ii) be implemented with a 2 port RAM (1 port for reading and 1 port for writing) without the need for a byte enable input, and/or (iii) support accesses of variable data length (e.g., from 1 byte to full FIFO line) and one cycle per access (e.g., read, write or read and write in parallel).

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention may implement a first-in first-out (FIFO) memory that may store a variable size of data. The FIFO may perform push and/or pop operations in one clock cycle of a reference clock. An addressable RAM may be implemented with one port for read operations and one port for write operations without the need for a byte enable input. For data having sizes of 1 to N bytes, the size of a particular line in the FIFO will normally be N bytes.

Figure 2:
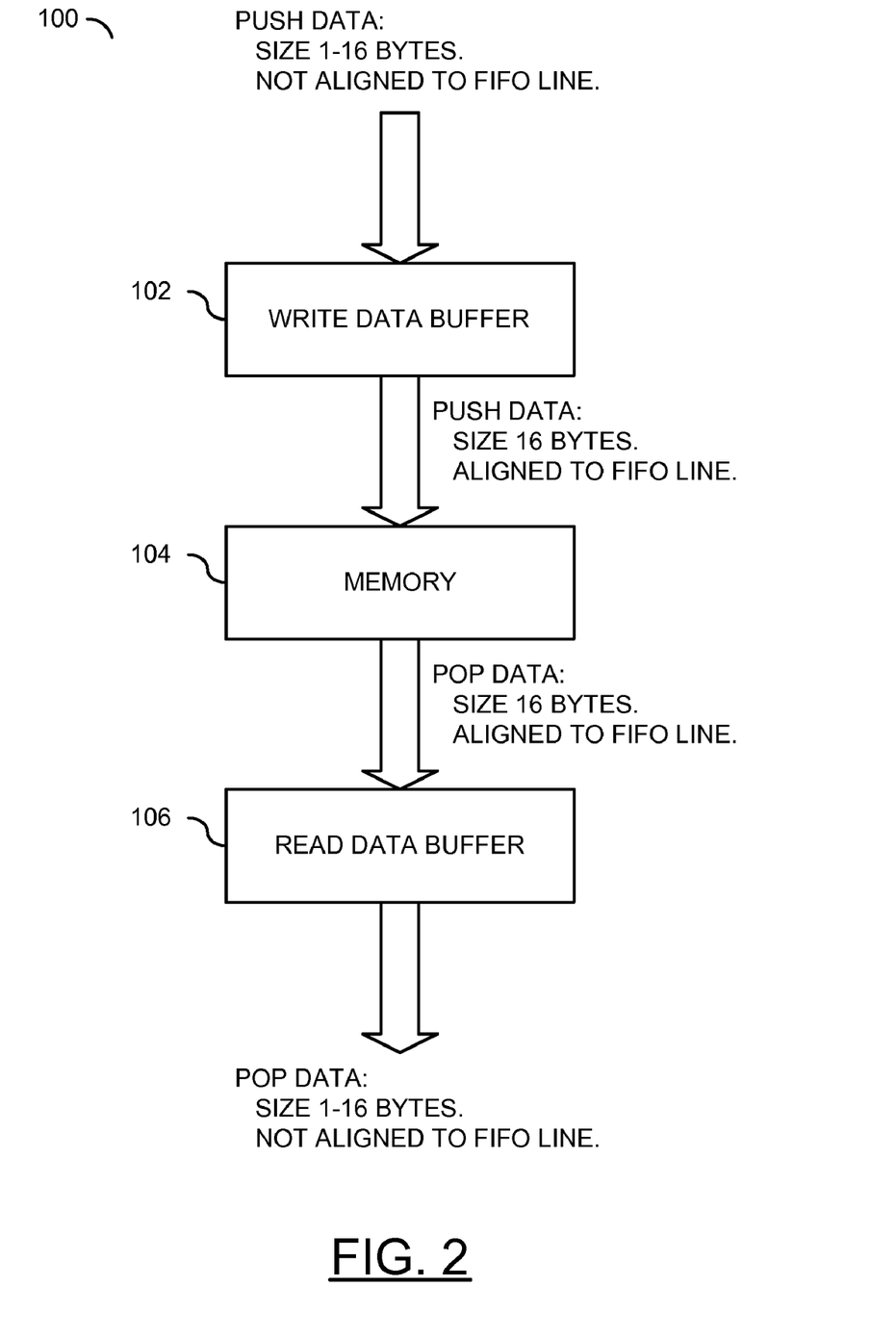
FIG. 2 is a diagram of an implementation of the present invention.

Referring to FIG. 2, a block diagram of a circuit 100 is shown in accordance with a preferred embodiment of the present invention. The circuit 100 generally comprises a block (or circuit) 102, a block (or circuit) 104 and a block (or circuit) 106. The circuit 102 may be implemented as a write data buffer. The circuit 104 may be implemented as a memory. The circuit 106 may be implemented as a read data buffer. In one example, the memory 104 may be implemented as a random access memory (RAM). However, other types of memory may be implemented to meet the design criteria of a particular implementation. In one example, the memory 104 may be implemented in a configuration of 16 bytes by 128 lines. However, the particular size of the memory 104 may be varied to meet the design criteria of a particular implementation.

The write buffer circuit 102 may be implemented to buffer write data. In one example, the write buffer circuit 102 may be implemented as 2 lines of flip-flops. The memory 104 may be implemented as an addressable RAM. In one example, the memory 104 may have a size of (N×M, where M is the number of lines of the FIFO). The memory 104 may sequentially progress through the plurality of lines. The buffer circuit 106 may be implemented to buffer read data. The buffer 106 may be implemented as 2 lines of flip-flops. The total size of the FIFO may be (M+4)×N bytes. The write buffer circuit 102 and the read buffer circuit 106 may be implemented to a translate one or more variable length accesses to a full line access.

Figure 3:
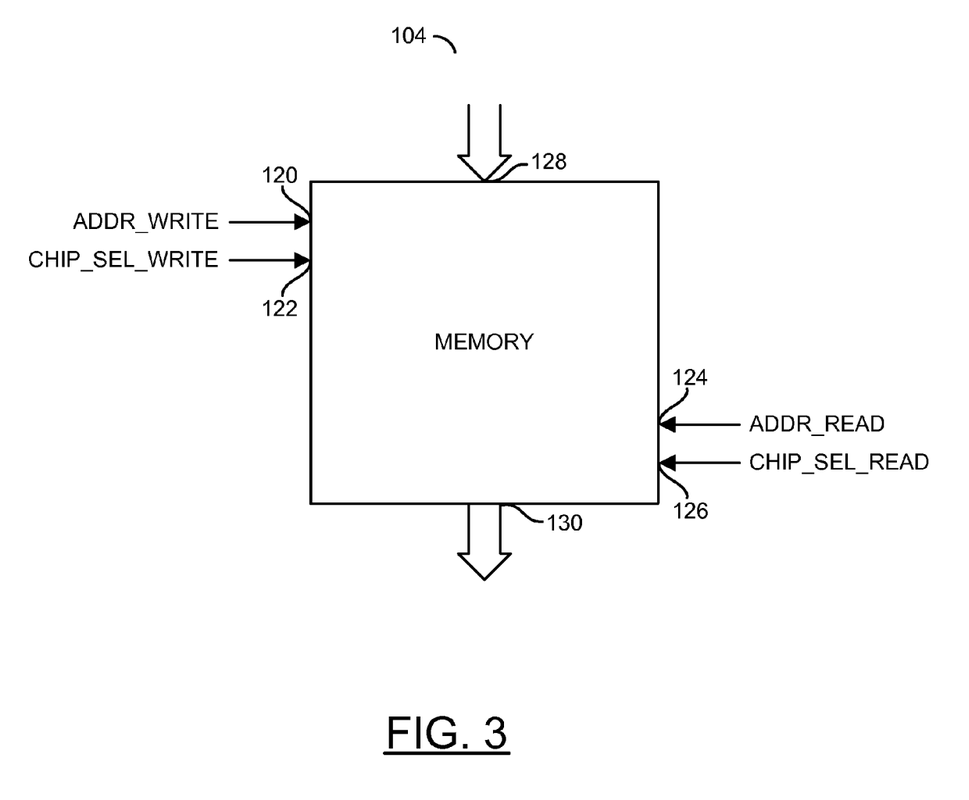
FIG. 3 is a more detailed diagram of the memory of FIG. 2.

Referring to FIG. 3, a more detailed diagram of a memory 104 is shown. The memory 104 may have an input 120 that may receive a signal (e.g., ADDR_WRITE), an input 122 that may receive the signal (e.g., CHIP_SEL_WRITE), an input 124 that may receive the signal (e.g., ADDR_READ), and an input 126 that may receive the signal (e.g., CHIP_SEL_READ). The circuit 104 may also have an input 128 that may receive data to be written to the memory 104 and an output 130 that may present data previously stored in the memory 104.

When a write operation to the circuit 100 is executed, data is written to the write data buffer circuit 102. When a full line is available in the write data buffer circuit 102, the full line is transferred to the memory 104. Writing to the memory 104 generally involves setting the signal ADDR_WRITE to match a write line pointer, asserting the signal CHIP_SEL_WRITE and presenting an entire row of data from the write data buffer circuit 102 to the input 128.

The write data buffer circuit 102 may operate as FIFO with 2 lines—(i) a push into the write data buffer circuit 102 that may be done in response to a user request and (ii) a pop from the write data buffer circuit 102 to the memory 104 that may be done automatically. Since the maximum data size of the pop is full line, an overflow of the write data buffer circuit 102 can not occur.

When there is an access that crosses a line boundary, the data is written to the two lines of the write data buffer 102 and then transferred to the memory 104 as the lines become filled. The write access to the memory 104 may be two lines in one clock cycle. Examples of a write operations are described in connection with FIGS. 4-7.

When the memory 104 is not empty, and the read data buffer circuit 106 has empty line, a full line (e.g., the oldest line that was pushed to the memory 104) is transferred to the read data buffer 106. Reading from the memory 104 generally includes setting the signal ADDR_READ to match a write line pointer and asserting the signal CHIP_SEL_READ. The memory 104 may respond to the address and chip select by presenting the read access data at the output interface 130 a short time later. The read access data may then be written into the read data buffer 106. When a read operation from the circuit 100 is executed, the data in the read data buffer 106 may be presented.

The read data buffer circuit 106 may operate as FIFO with 2 lines—(i) a pop is done from the read data buffer circuit 106 on user request and (ii) a push into the read data buffer circuit 106 from the memory 104 is done automatically. When there is an access that crosses a line boundary, the data is read from the two lines of the read data buffer 106. New data is then transferred from the memory 104 to refill the read data buffer 106. The circuit 100 may access two lines in one cycle. Examples of a read operations are described in more detail in connection with FIGS. 8-11.

In a case where a frequency translation is not needed when reading data from the memory 104, the read buffer circuit 106 may be implemented with only one line. Part of the read data may be read directly from the memory 104. In case there is read of full line with unaligned address (e.g., line is 16 bytes and address bits 3-0 are not "0") part of the data is read from the read buffer 106 and a new line is read from the memory 104. The remaining bytes of the line that was read from the memory 104 are stored in the read buffer 106. Similarly, implementing a write data buffer 102 with only 1 line may be possible.

Referring to FIGS. 4-7, diagrams illustrating an example sequence of write operations to the memory 104 is shown. In the example shown, multiple write operations (e.g., three) may be performed back to back illustrating a write pipeline. When accessing the circuit 100, the write data buffer 102 normally receives the data during a particular cycle and may write the data to the memory 104 during the next cycle. The write buffer 102 may be implemented as a register based buffer.

Figure 4:
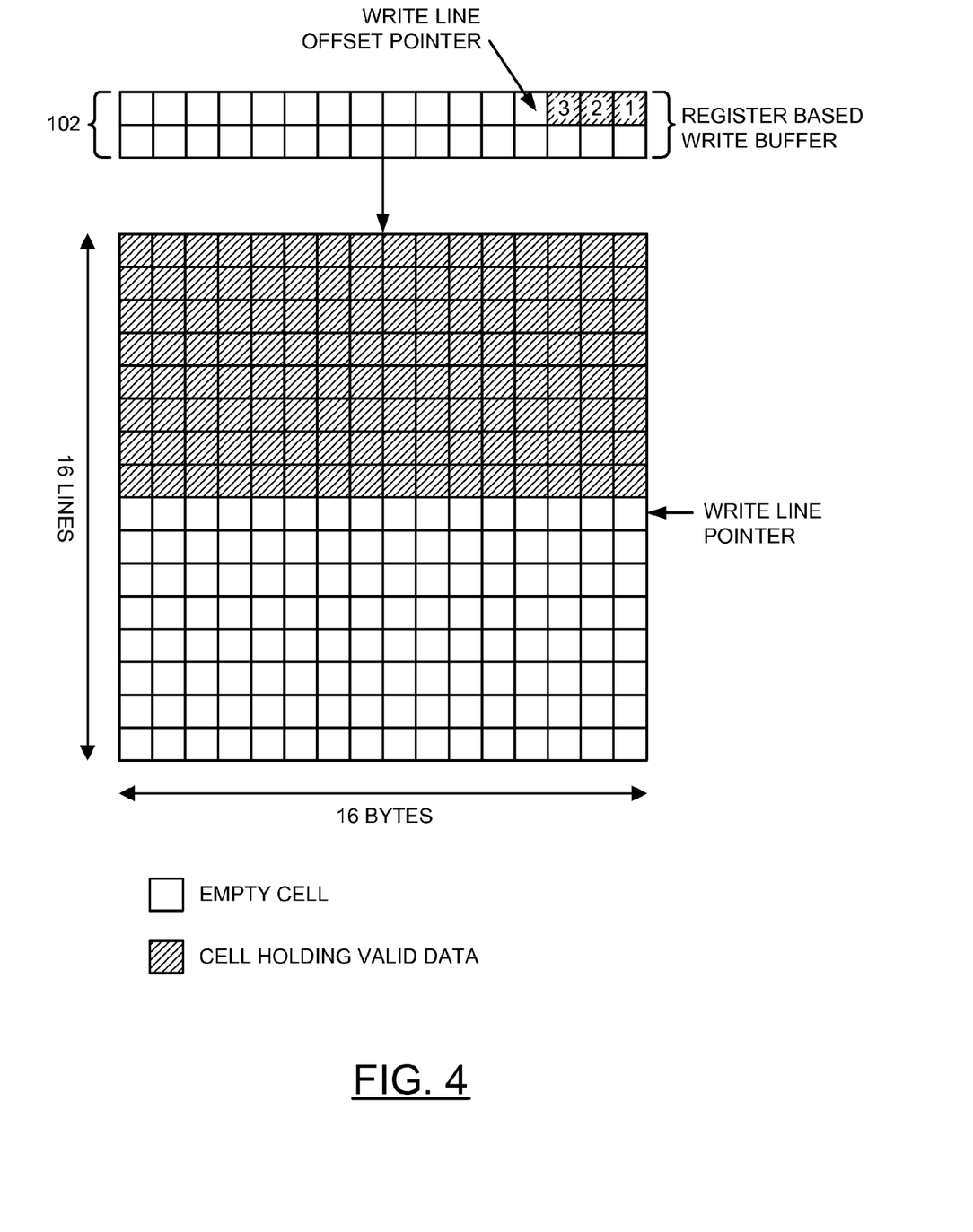
FIG. 4 is a diagram of an initial condition for a write operation.

Referring to FIG. 4, a diagram illustrating an initial condition for the write operations shown. In the example, the write data buffer 102 may contain less than a full row of data (e.g., bytes 1-3 in a top row) and the memory 104 may contain previously written data (e.g., shaded cells). A write line offset pointer may point to a next open cell in the top row of the write data buffer 102. A write line pointer generally points to the next open row in the memory 104. Since the write data buffer 102 does not have a full row, the partial row of data may remain in the write data buffer 102 for the time being.

Figure 5:
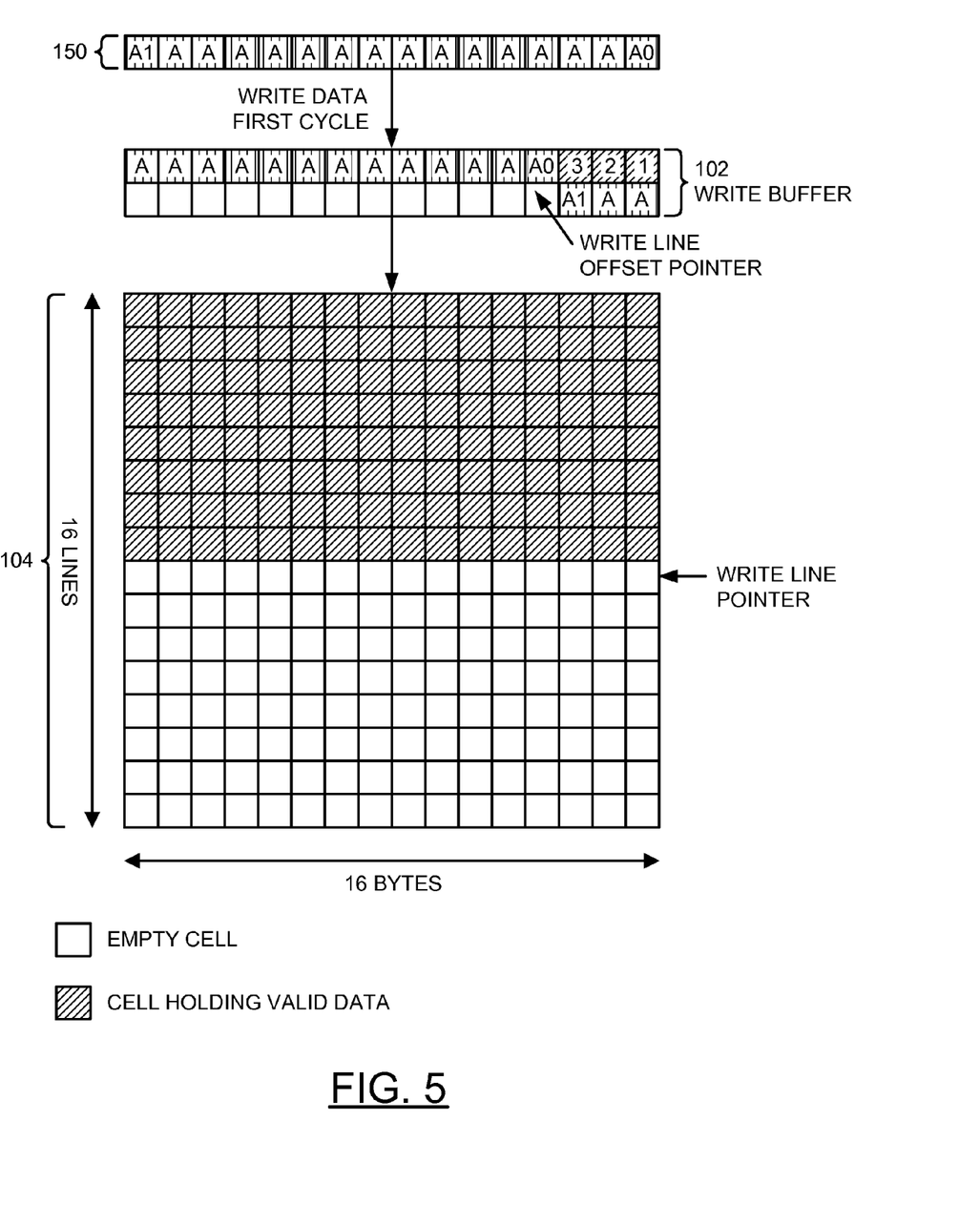
FIG. 5 is a diagram of an initial write operation.

Referring to FIG. 5, a diagram illustrating an example of an initial write operation to the memory 104 is shown. An input data 150 (e.g., bytes A1, A, . . . , A, A0) is shown written to the write buffer 102. During the initial write operation, the input data 150 may be copied into the write data buffer 102 starting at the cell identified by the write line offset pointer. The right-most bytes of the input data 150 may be copied into the open cells with the right-most byte A0 adjacent the previously written byte 3. Since the number of bytes in the input data 150 exceed the open cells available on the top row, several bytes (e.g., 13 bytes) may be written to the top row and the remaining bytes (e.g., 3 bytes) may wrap around to the cells in the bottom row of the write data buffer 102. The write line offset pointer may be moved to the next open cell in the bottom row adjacent the last byte (e.g., byte A1) of the input data 150.

Figure 6:
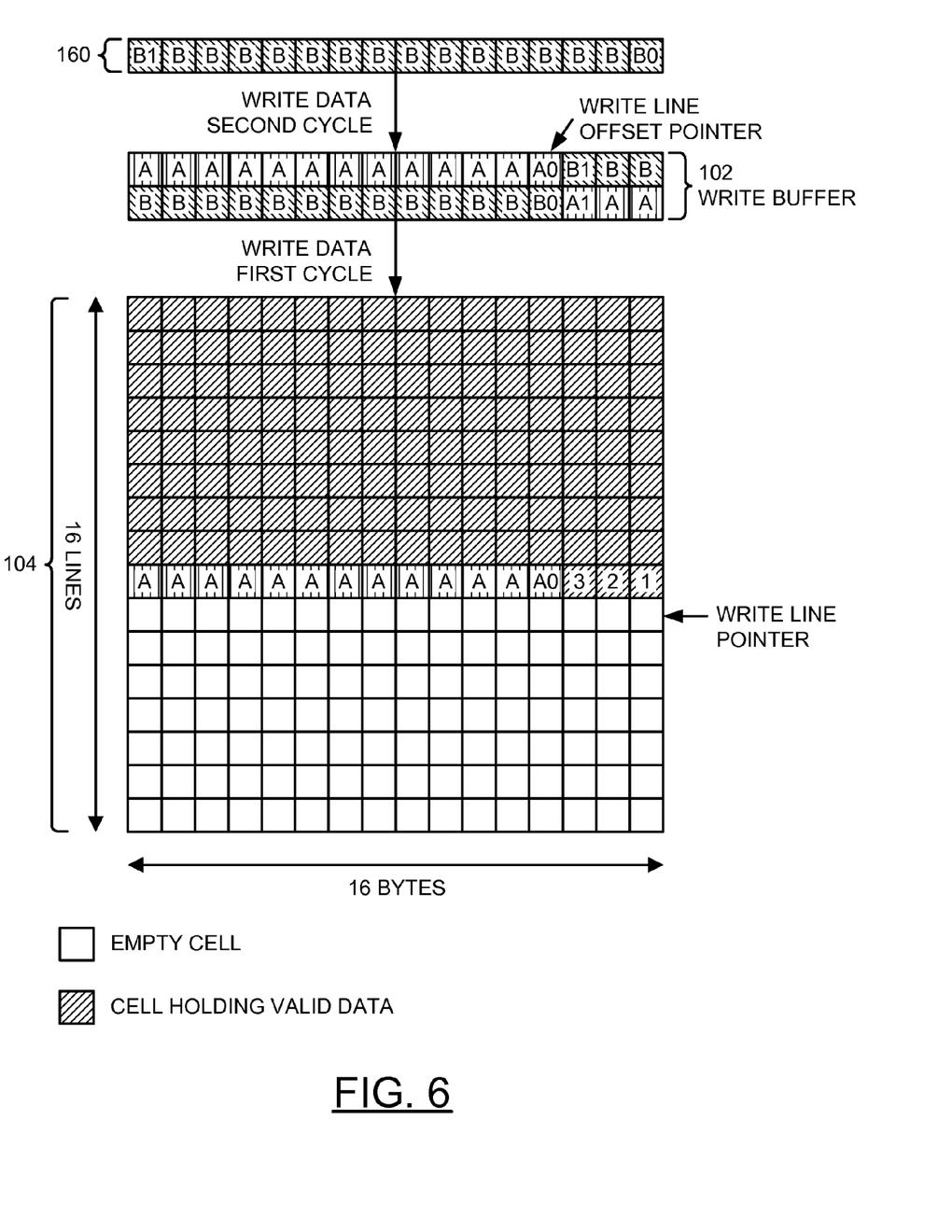
FIG. 6 is a diagram of a next a write operation.

Referring to FIG. 6, a diagram illustrating an example of a next write operation to the memory 104 is shown. Since the initial write operation completely fills the top row of the write data buffer 102, the top row may be automatically copied from the write data buffer 102 into the memory 104. The top row is generally copied to the next open row of the memory 104 identified by the write line pointer. The copy generally writes data from both the previously written input data (e.g., 3, 2, 1) and a portion of the input data 150 (e.g., A, A, . . . , A, A0) of the initial write operation in a single cycle to the memory 104. The write line pointer may be moved to the next open line in the memory 104, as illustrated. If the write line pointer was pointing to the bottom row, the write line pointer may wrap around to the top row of the memory 104.

New input data 160 (e.g., B2, B, . . . , B, B0) may be subsequently written into the write buffer 102 as part of the next write operation. The input data 160 may be written into the write data buffer 102 starting at the cell identified by the write line offset pointer. Since the number of bytes of the input data 160 exceeds the number of open cells in the bottom row of the write data buffer 102, several bytes of the input data 160 may be buffered in the bottom row and the remaining bytes of the input data 160 may be wrapped around to the top row. The remaining bytes of the input data 160 may overwrite the previous data (e.g., bytes 3, 2, 1) in the top row. The write line offset pointer may be moved to the next cell to the left of the last byte of the input data 160 (e.g., byte B1), as shown.

Figure 7:
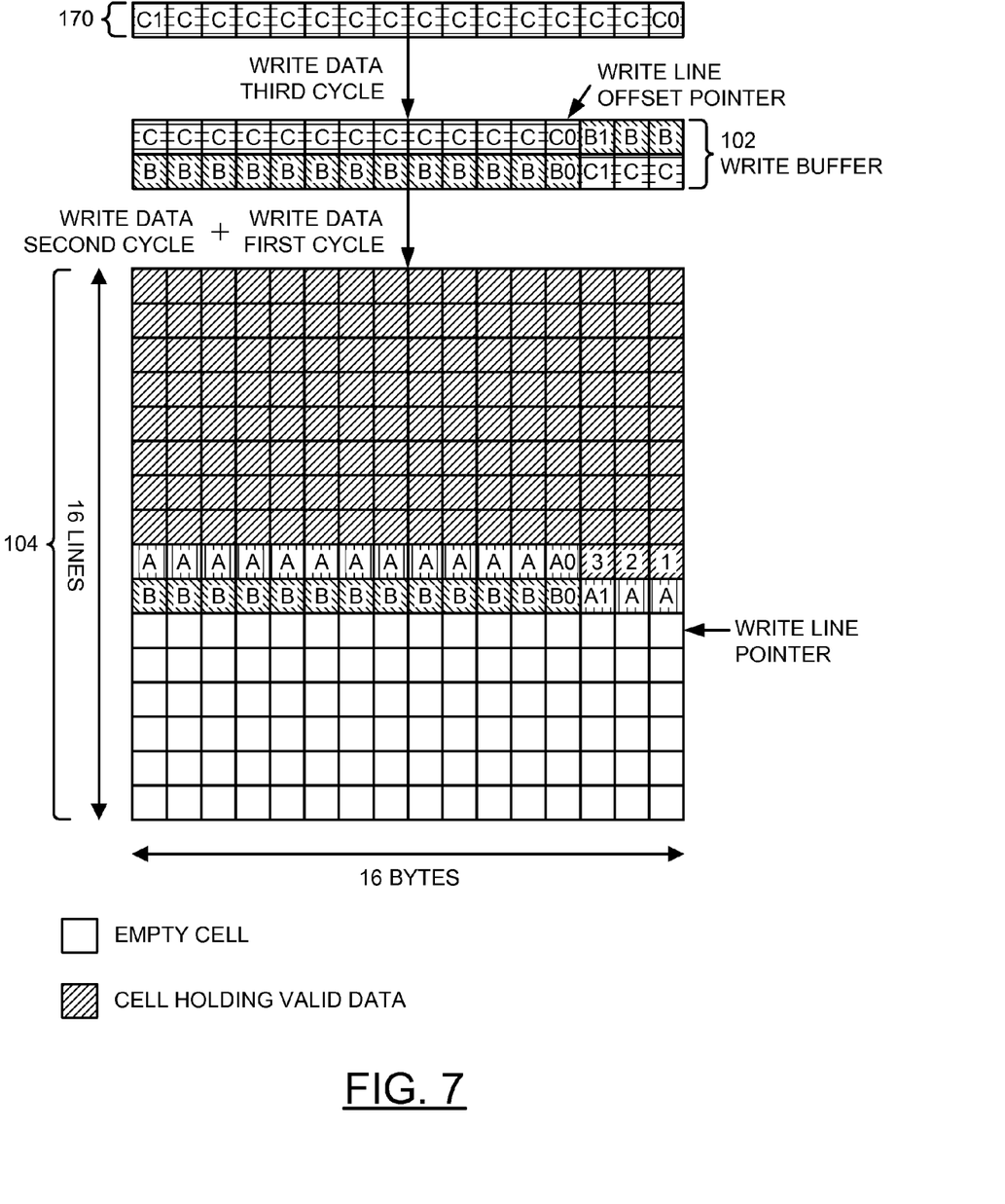
FIG. 7 is a diagram of a subsequent write operation.

Referring to FIG. 7, a diagram illustrating an example of a subsequent write operation to the memory 104 is shown. Since the previous write operation (FIG. 6) completely fills the bottom row of the write data buffer 102, the bottom row may be automatically copied from the write data buffer 102 into the memory 104. The bottom row is generally copied to the next open row of the memory 104 identified by the write line pointer. The copy generally writes the remaining portion of the input data 150 (e.g., A1, A, A) from the initial write operation and a portion of the input data 160 (e.g., B, B, . . . , B, B0) from the next write operation in a single cycle to the memory 104. The write line pointer may be moved to the next open line in the memory 104, as illustrated.

Additional input data 170 (e.g., C1, C, ..., C, C0) may be subsequently written into the write buffer 102 as part of the subsequent write operation. The input data 170 may be written into the write data buffer 102 starting at the write line offset pointer, as illustrated. Since the number of bytes of the input data 170 also exceeds the number of open cells in the top row, several bytes (e.g., 13 bytes) of the input data 170 may be buffered in the top row and the remaining bytes (e.g., 3 bytes) may be buffered in the bottom row.

The process of automatically writing full rows from the write data buffer 102 to the memory 104 may continue once the subsequent write operation has finished. The portion of the input data 170 that remains in the bottom row of the write data buffer 102 may stay in the write data buffer 102 until either a new write operation fills the bottom row and/or the input data 170 is to be read from the circuit 100. When either condition is satisfied, the remaining input data 170 may be copied from the bottom row of the write data buffer 102 to the memory 104.

Referring to FIGS. 8-11, diagrams illustrating an example sequence of read operations from the memory 104 is shown. In the example shown, multiple read operations (e.g., three) may be performed back to back illustrating a read pipeline. The read data buffer 106 may be configured as a single line buffer in the example. When accessing the circuit 100, the read data buffer 106 generally receives the read data of the oldest line (row) from the memory 104. A multiplexer 176 may receive next oldest line from the from the memory 104. Full lines may be read from the memory 104 on each read access. As such, the multiplexer 176 may have 32 bytes available from the two oldest lines to choose from. If the read data being accessed is fully within the read data buffer 106, the multiplexer 176 may present the read data from the read data buffer 106. If the read data being accessed crosses a line boundary in the memory 104, the multiplexer 176 may present a portion of the read data from the oldest line as held in the read data buffer 106 and a portion of the read data from the next oldest line as held in the memory 104.

Figure 8:
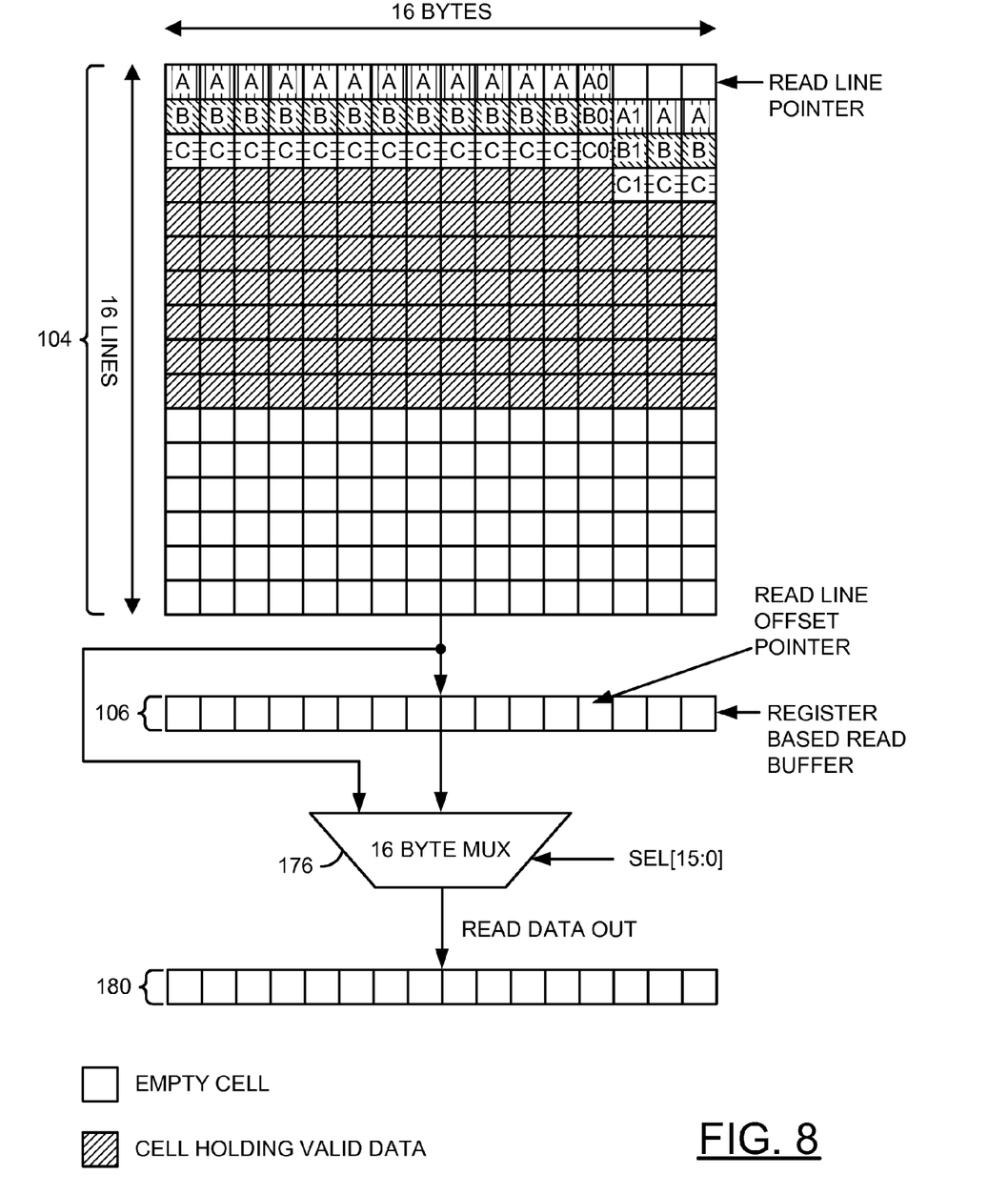
FIG. 8 is a diagram of an initial condition for a read operation.

Referring to FIG. 8, a diagram illustrating an initial condition for the read operations shown. In the example, the read data buffer 106 may be empty and the memory 104 may contain previously written data (e.g., shaded cells). The read line offset pointer may point to an open cell in the read data buffer 106. The read line pointer generally points to the oldest line of data in the memory 104.

Figure 9:
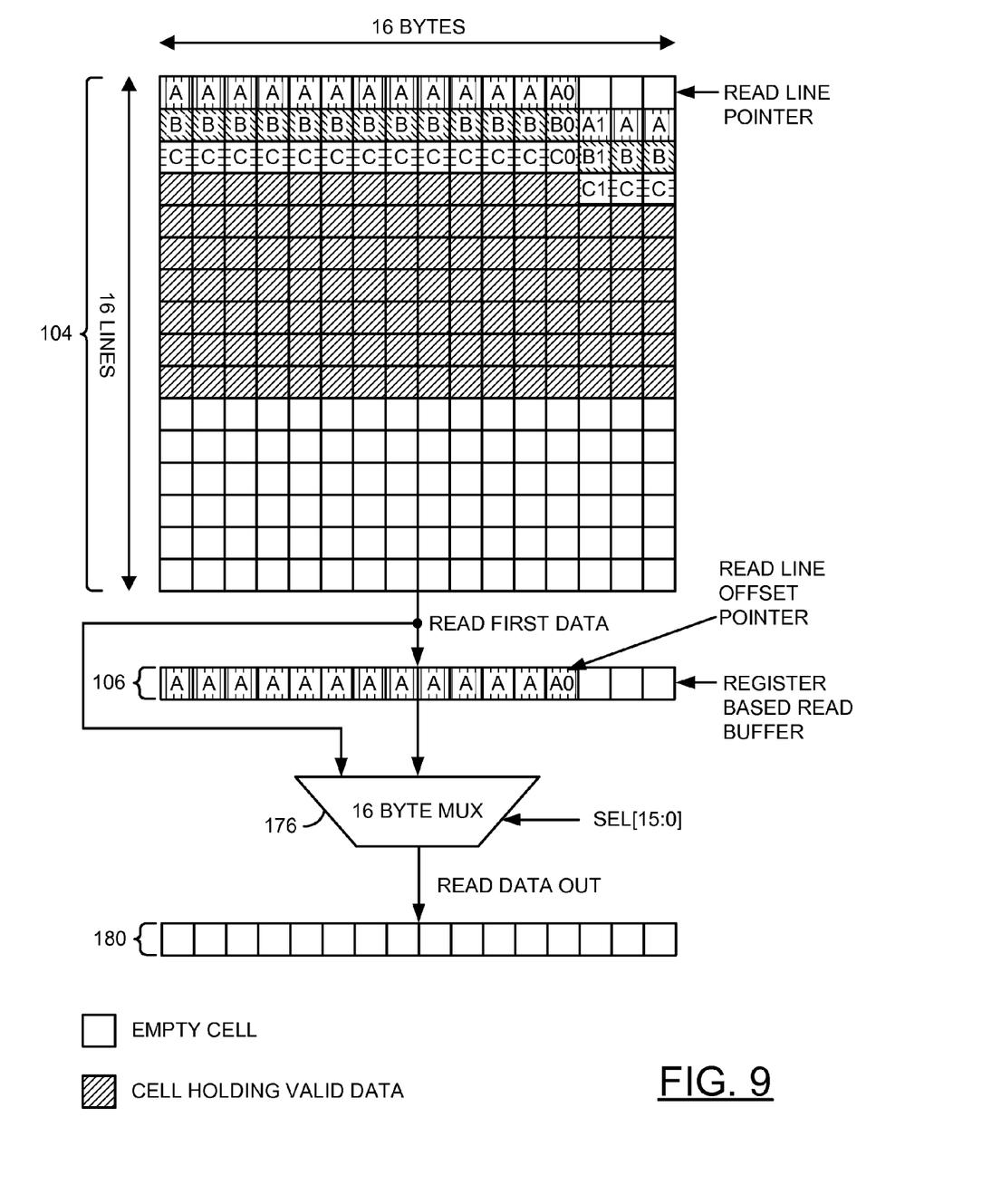
FIG. 9 is a diagram of an initial read operation.

Referring to FIG. 9, a diagram illustrating an example of an initial read operation from the memory 104 is shown. Since the read data buffer 106 has an empty row, a line of data identified by the read line pointer (as illustrated) may be automatically copied from the memory 104 to the read data buffer 106. The copied data may be written into the read data buffer 106 right-justified to the single row of the read data buffer 106. Since the oldest data (e.g., A, A, ..., A, A0) was written unaligned with the row boundaries of the memory 104, the oldest data may be unaligned with the row boundaries of the read data buffer 106. The read line pointer generally identifies the right-most byte of the oldest data.

Figure 10:
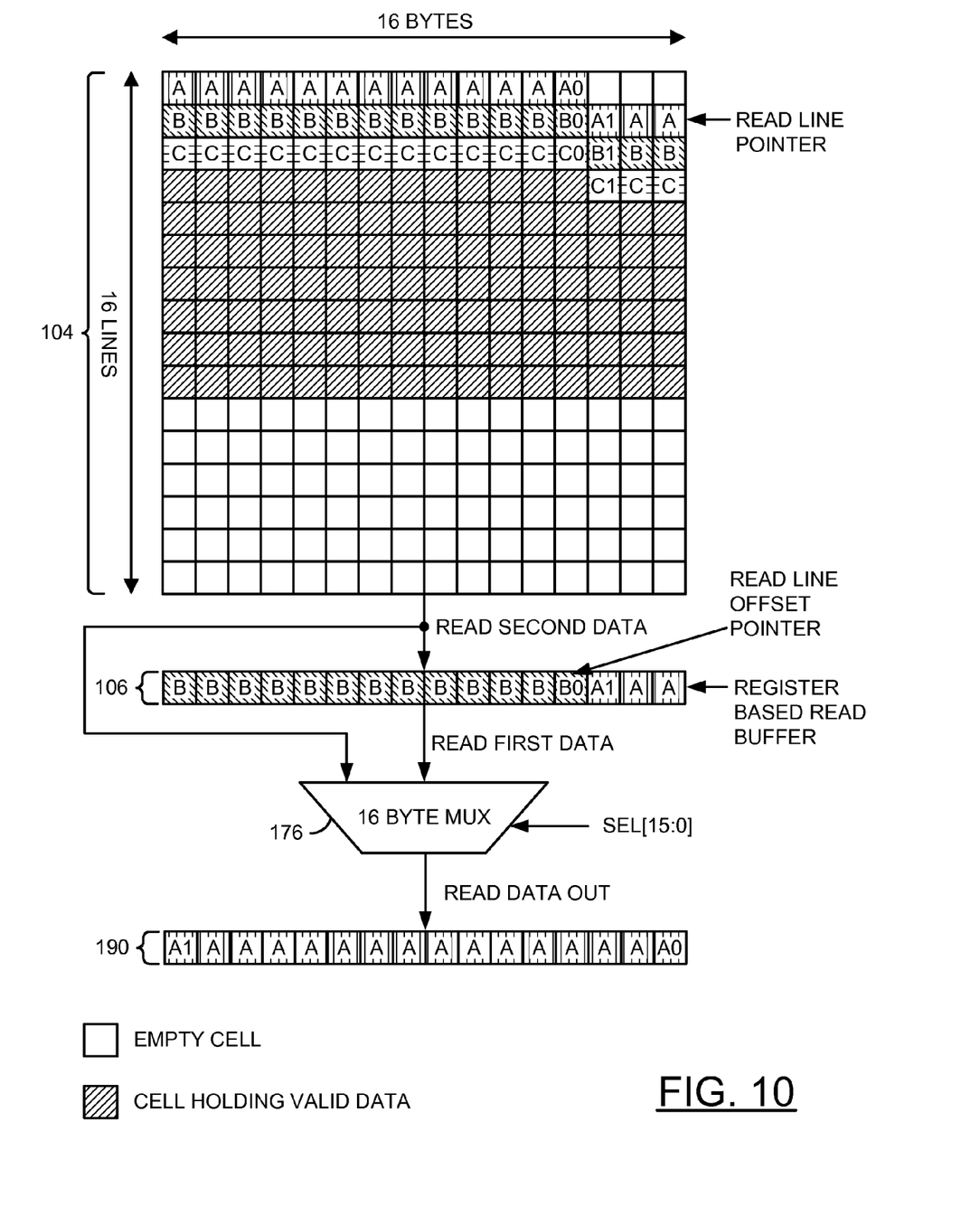
FIG. 10 is a diagram of a next read operation.

Referring to FIG. 10, a diagram illustrating an example of a next read operation from the memory 104 is shown. The next (second) oldest line of data (e.g., B, B, ..., B0, A1, A, A) at the read line pointer may be read from the memory 104. The 16 bytes of the next oldest data may be concatenated (appended) with the oldest data in the write data buffer 106 at the inputs of the multiplexer 176 to form a 32-byte input. The signal SEL may identify a size of the read access (e.g., 1 to 16 bytes) and an alignment of the read access (e.g., the byte pointed to by the read line offset pointer) to multiplex from the 32 input bytes. As illustrated, the size and alignment may cause the 16 bytes of the oldest data (e.g., A1, A, ..., A, A0) to be presented as read data out 190. In the example, the read access of the oldest data may return bytes from two different lines of the memory 104 in a single cycle. Once the read data out 190 has been read from the read data buffer 106, the next oldest line may be automatically written into the write data buffer 106, as illustrated. The read line pointer may be moved to the subsequent (third) oldest data in the memory 104. The read line offset pointer may be updated to point to the right-most byte of the second oldest data.

Figure 11:
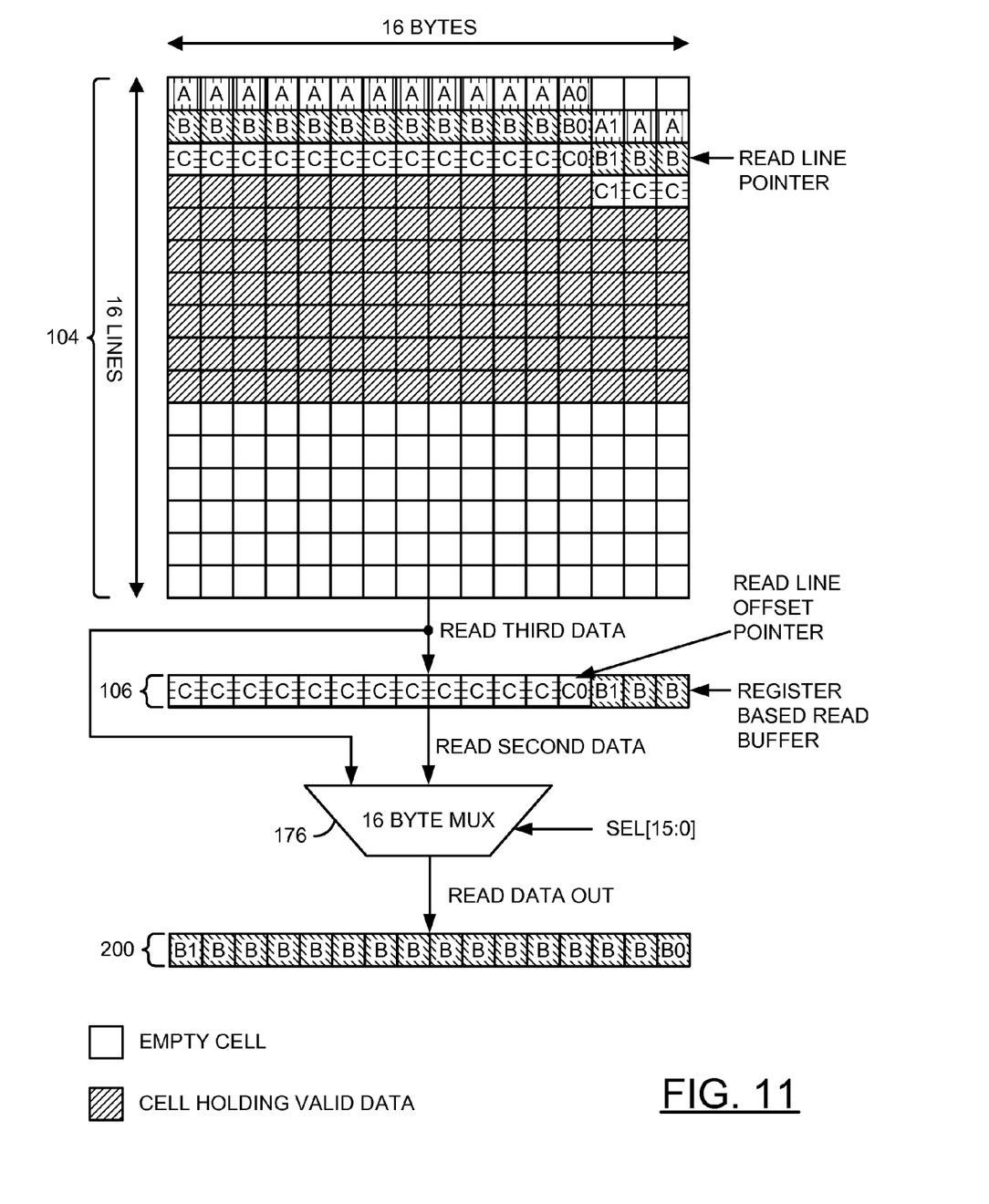
FIG. 11 is a diagram of a subsequent read operation.

Referring to FIG. 11, a diagram illustrating an example of a next read operation from the memory 104 is shown. A line of subsequent (third) oldest data (e.g., C, C, ..., C, C0, B1, B, B) at the read line pointer may be read from the memory 104 during the next read operation. The subsequent oldest data from the memory 104 may be concatenated (appended) with the next oldest data in the read data buffer 106 at the 32 inputs of the multiplexer 176. The signal SEL may identify a size of the read access and an alignment of the read access to multiplex from the 32 input bytes. As illustrated, the size and alignment may cause the 16 bytes of the next oldest data (e.g., B1, B, ..., B, B0) to be presented as read data out 200. In the example, the read access of the next oldest data may return bytes from two different lines of the memory 104 in a single cycle. Once the read data out 200 has been read from the read data buffer 106, the subsequent oldest line may be automatically written into the write data buffer 106, as illustrated. The process of automatically reading full rows from the memory 104 to the read data buffer 106 may continue once the subsequent write operation has finished. The portion of the oldest data that remains in the read data buffer 106 may stay in the read data buffer 106 until accessed by a new read access.

Figure 12:
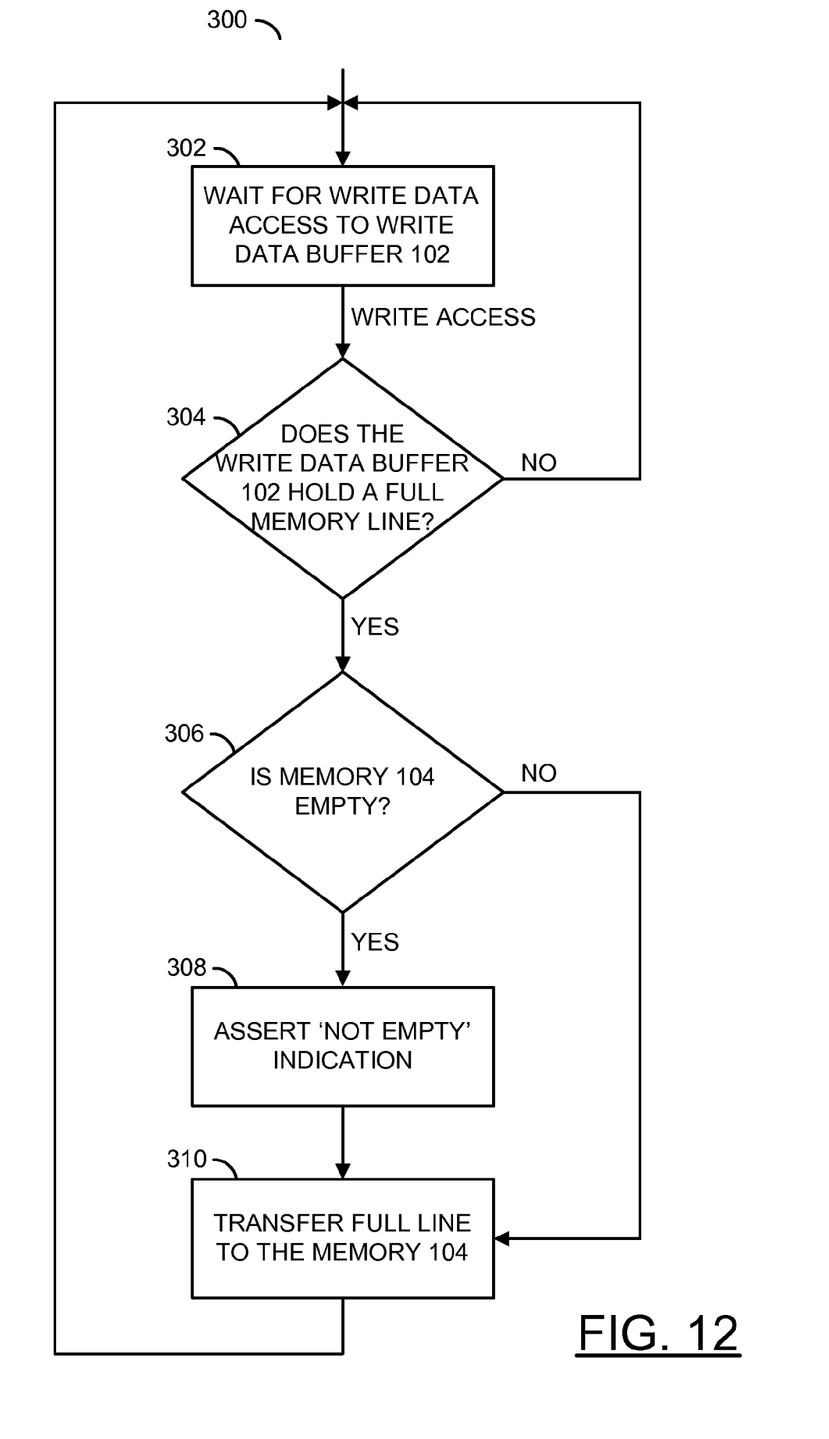
FIG. 12 is a diagram of a write data flow.

Referring to FIG. 12, a diagram of a method (or process) 300 illustrating a write data flow is shown. The method 300 generally comprises a state 302, a decision state 304, a decision state 306, a state 308, and a state 310. The state 302 may wait for a write data access to the write data buffer 102. The state 302 may perform a write access. Next, the decision state 304 determines if the write data buffer 102 holds a full memory line. If not, the process 300 returns to the state 302. If so, the process 300 moves to the decision state 306. The decision state 306 determines whether the memory 104 is empty. If so, the method 300 moves to the state 308. If not, the process 300 moves to the state 310. In the state 308, the method 300 asserts a not empty flag. In the state 310, the process transfers a full line of data to the memory 104. After the step 308, the process moves to the step 310. After the step 310, the process 310 moves back to the step 302.

Figure 13:
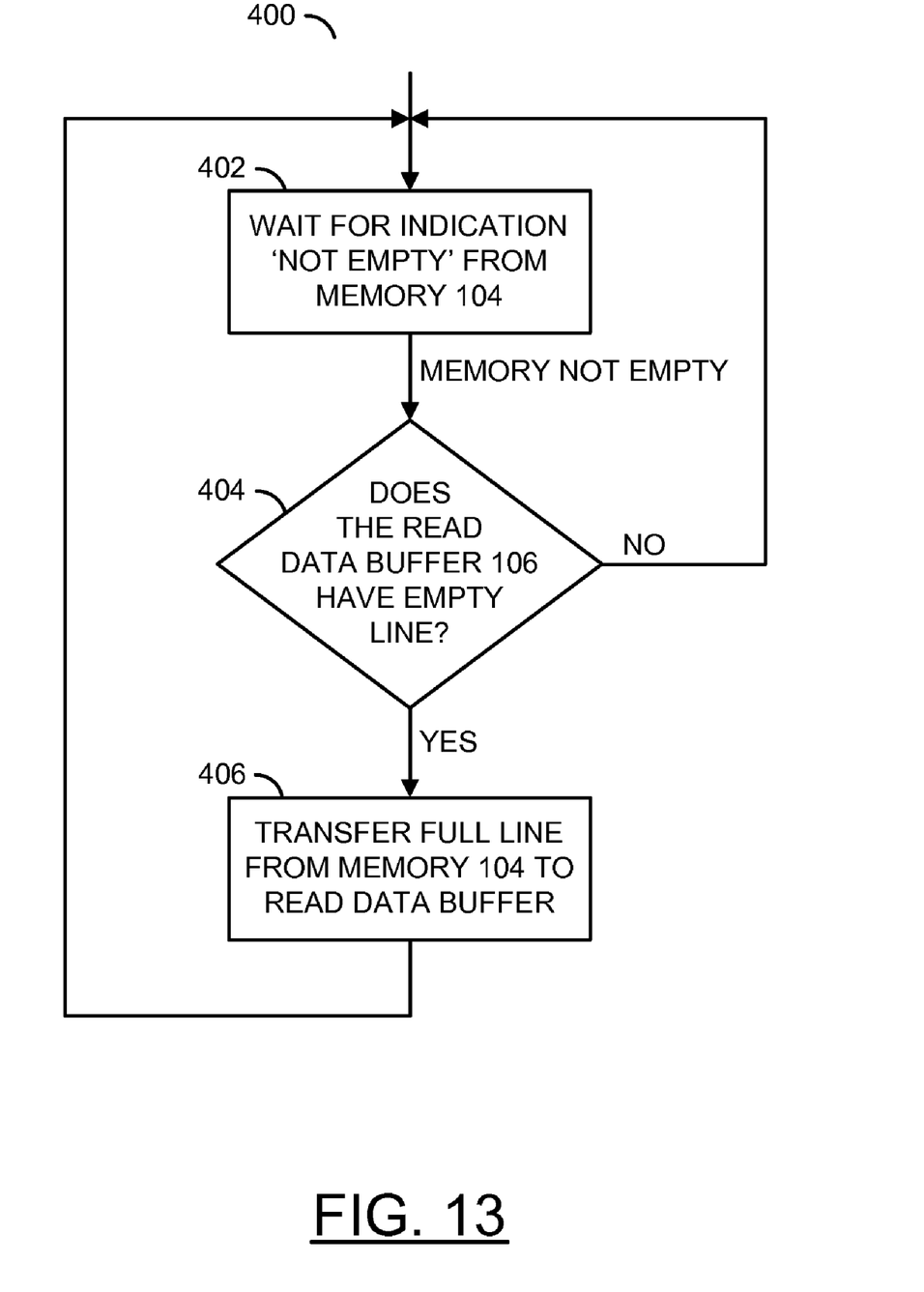
FIG. 13 is a diagram of a read data flow.

Referring to FIG. 13, a method (or process) 400 is shown illustrating a read flow. The process 400 generally comprises a state 402, a decision state 404, a state 406. The state 402 waits for an indication of "not empty" from the memory 403. Next, the method 400 moves to the state 404. The decision state 404 determines whether the read data buffer 106 has an empty line. If not, the method 400 moves back to the state 402. If so, the method 400 moves to the state 406. The state 406 transfers a full line from the memory 104 to the read data buffer 106. Next, the method 400 moves back to the state 402. In general, data is available for a read operation at any access size (e.g., an X size is generally the memory width). The process 400 leads back to checking if the memory is not empty and the read data buffer has an empty line.

The memory 104 may contain one extra wordline (e.g., a registers line). For systems that allow "backdoor" reading and writing of the memory 104 (e.g., for debug), it may be possible to write and read one extra line before the memory 104 is full.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed)to meet the design criteria of a particular implementation. Additionally, inverters may be added to change a particular polarity of the signals.

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more integrated circuits, one or more chips or die arranged as flip-chip modules and/or multi-chip modules or by interconnecting an appropriate network of conventional component circuits, as is described herein, modifications of which will be readily apparent to those skilled in the art(s).

While the invention has been particularly shown and described with reference to the preferred embodiments thereof, it will be understood by those skilled in the art that various changes in form and details may be made without departing from the scope of the invention.

The invention claimed is:

1. An apparatus comprising:
    a write data buffer circuit configured to present data in a second format in response to data received in a first format;
    a memory configured to (i) receive said data in said second format and (ii) present said data in said second format; and
    a read data buffer circuit configured to (i) receive said data in said second format and (ii) present data in a third format, wherein said memory is configured to allow two reads or two writes during a single clock cycle of a reference clock without encountering a data overflow condition.

2. The apparatus according to claim 1, wherein said memory comprises an addressable memory.

3. The apparatus according to claim 1, wherein said memory comprises a Random Access Memory (RAM).

4. The apparatus according to claim 1, wherein said memory comprises a single read port and single a write port.

5. The apparatus according to claim 1, wherein said write data buffer comprises a first-in first-out (FIFO) buffer.

6. The apparatus according to claim 1, wherein said read data buffer comprises a first-in first-out (FIFO) buffer.

7. The apparatus according to claim 1, wherein said memory is configured to store and access a plurality of lines of data.

8. The apparatus according to claim 7, wherein said write data buffer is configured to hold two of said plurality of lines of data.

9. The apparatus according to claim 8, wherein said read data buffer is configured to hold two of said plurality of lines of data.

10. The apparatus according to claim 9, wherein said first data format is aligned with the lines of said write data buffer.

11. The apparatus according to claim 7, wherein said second format comprises data aligned to one or more of said plurality of lines of said memory.

12. The apparatus according to claim 1, wherein said first format comprises data that is not aligned to one or more of a plurality of lines of said memory, said second format comprises data that is aligned to one or more of said plurality of lines of said memory, and said third format comprises data that is not aligned to one or more of said plurality of lines of said memory.

13. The apparatus according to claim 1, wherein said apparatus is implemented as one or more integrated circuits.

14. An apparatus comprising:
    means for presenting data in a second format in response to data received in a first format;
    means for (i) receiving said data in said second format and (ii) presenting said data in said second format; and
    means for (i) receiving said data in said second format and (ii) presenting data in a third format, wherein said apparatus is configured to allow two reads or two writes during a single clock cycle of a reference clock without encountering a data overflow condition.

15. A method for accessing a memory, comprising the steps of:
    presenting data in a second format in response to data received in a first format;
    receiving said data in said second format and presenting said data in said second format; and
    receiving said data in said second format and presenting data in a third format, wherein said memory is configured to allow two reads or two writes during a single clock cycle of a reference clock without encountering a data overflow condition.

* * * * *